ary Examiner—William H. Schultz
United States Patent [19]
Taylor et al.

[11] 4,353,518
[45] Oct. 12, 1982

[54] CABLE RETRACTOR

[75] Inventors: William R. Taylor; Richard J. Gonia, both of New Berlin, Wis.

[73] Assignee: General Electric Company, Schenectady, N.Y.

[21] Appl. No.: 219,053

[22] Filed: Dec. 22, 1980

[51] Int. Cl.³ .............................................. F16L 3/00
[52] U.S. Cl. ..................................... 248/60; 312/223; 248/281.1
[58] Field of Search ...................... 248/49, 51, 60, 65, 248/280.1, 281.1; 433/79; 312/223, 194; 361/390, 391

[56] References Cited

U.S. PATENT DOCUMENTS

| | | | |
|---|---|---|---|
| 919,777 | 4/1909 | Savin et al. | 248/281.1 |
| 1,636,366 | 7/1927 | Hubener | 248/51 |
| 2,133,332 | 10/1938 | Pieper | 433/79 |

Primary Examiner—William H. Schultz
Assistant Examiner—Ramon O. Ramirez
Attorney, Agent, or Firm—Ralph G. Hohenfeldt

[57] ABSTRACT

Cable retractor adapted to support and guide a slack portion of a cable connected between a stationary rack and a chassis which is slidable out of the rack. The cable retractor has brackets fixed to the moving chassis and to the rack, arms pivoted to each bracket and to a common pivot plate and standoffs to attach the slack portion of a cable to the arms so that a bend portion of the cable is positioned in spaced relation from the pivotal linkage between the first and second arms. The pivot plate linking the first and second arms has pivots which are suitably spaced to restrict the minimum bend radius of the slack portion of the cable.

4 Claims, 2 Drawing Figures

CABLE RETRACTOR

BACKGROUND OF THE INVENTION

This invention is a cable retractor used to support and guide a cable or a conduit connecting two sub-assemblies which move to a limited extent with respect to each other. The retractor can be used to support and guide a cable extending from a sliding rack mounted chassis to the stationary rack. Rack mounted chassis are frequently used to house electronic circuit boards and the like.

THE PRIOR ART cable retractors are generally known for supporting a cable extending from a drawer-like sliding chassis to a fixed rack which carries the chassis. Such cable retractors are intended to support and guide the slack portion of the cable which follows the moving chassis when the moving chassis is slid in or out of the rack. The retractor guides the motion of the cable so it will not become tangled with other cables and will not be undesirably kinked or chafed by the motion of the moving chassis.

The known cable retractors can damage the supported cable by allowing a small radius bend to develop in the cable near a cable clamp or by twisting the cable. Other known retractors allow the cable to chafe against the moving arm of the retractor.

SUMMARY OF THE INVENTION

One object of the invention is to provide a cable retractor which is intimately connected to the cable to provide support and guidance, while allowing the cable to be bent only in a predictable way to avoid kinking the cable. Another object of the present invention is to provide a cable retractor having a very simple and inexpensive construction which does not require a great number of parts. Another object of the present invention is to provide a cable retractor which does not bind, chafe against, or twist the cable unduly. Other objects of the present invention will become apparent from the description which follows.

The new retractor is adapted to allow retraction of a flexible element such as a cable which is conected between a rack and a chassis which is slidable within the rack.

The retractor has a first end bracket for attachment to a rack, a second end bracket for attachment to the sliding chassis and first and second arms pivoted to a ivot plate and to the first and second end brackets. A flexible cable extending between the rack and the sliding chassis can be connected to the first and second arms of the cable retractor by vertical stand-offs on the arms. The cable is thus attached to and carried with the retractor in a plane that is spaced from but parallel to the plane of the moving arms of the cable retractor.

A distinctive feature of the cbale retractor is that its first and second arms are arranged so that they stay substantially in a first plane throughout their entire range of motion, while the attached cable stays substantially in a distinct parallel plane throughout its entire range of motion.

Another distinctive feature of the new cable retractor is that the pivotal linkage connecting the two arms of the cable retractor comprises a single plate having two spaced apertures which rotatably support pivot pins fixed to the ends of the respective arms.

In a preferred embodiment of the invention, the pivot pins connecting the end brackets to the moving arms and the pivot pins connecting the moving arms to the pivot plate can be end portions of the moving arms which are bent at right angles to form integral pivot pins.

DESCRIPTION OF THE PREFERRED EMBODIMENT

Figure 1:
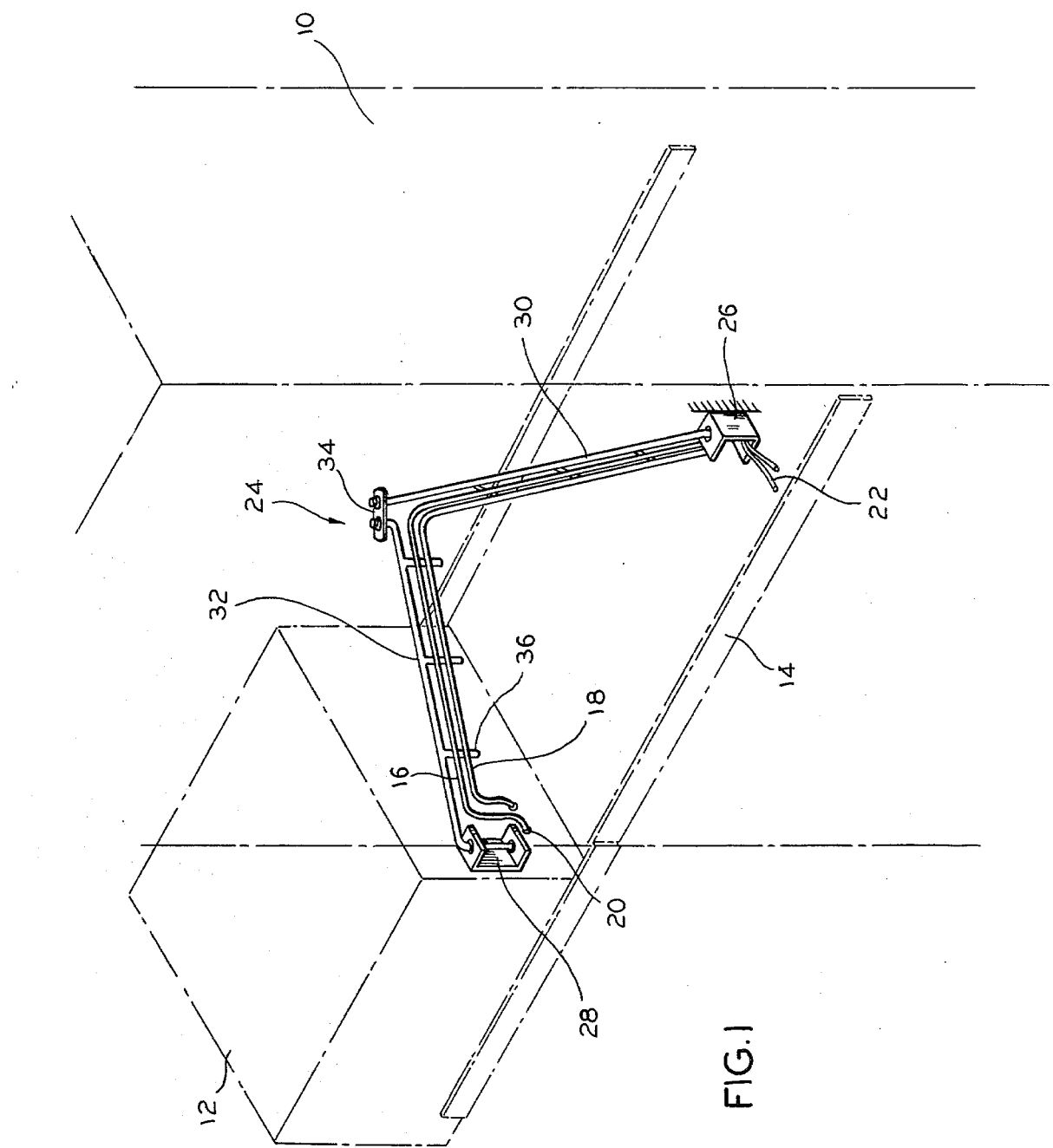
FIG. 1 is a perspective view of a sliding chassis in a rack mount, showing the cable retractor in a partially extended position supporting plural cables which electrically connect the chassis to the rack.

FIG. 1 shows a typical use of the new cable retractor. Rack 10 is a fixed cabinet in which moving chassis 12 is mounted on slides 14 much like a drawer. Cables such as 16 and 18 are connected at one end to moving chassis 12 and at the other end to rack 10. For example, cable 16 is attached to moving chassis 12 at point 20 and to rack 10 at approximately point 22. The slack portion of cable 16 between points 20 and 22 allows moving chassis 12 to be slid out of or into rack 10 to either extreme position allowed by track 14. In a typical rack mount the rack allows about 19 inches (48 cm) width for the chassis and tracks, and allows the chassis to slide out 30 inches (76 cm).

The slack portions of cables 16 and 18 are supported by cable retractor 24 which is comprised of a first end bracket 26 attached to rack 10, a second end bracket 28 affixed to the moving chassis 12, first and second arms 30 and 32, a common pivot plate 34 linking said first and second arms, and vertical standoffs such as 36 adapted to carry cables 16 and 18 in a plane which is separated from but parallel to the horizontal plane in which the first and second arms are allowed to move.

Figure 2:
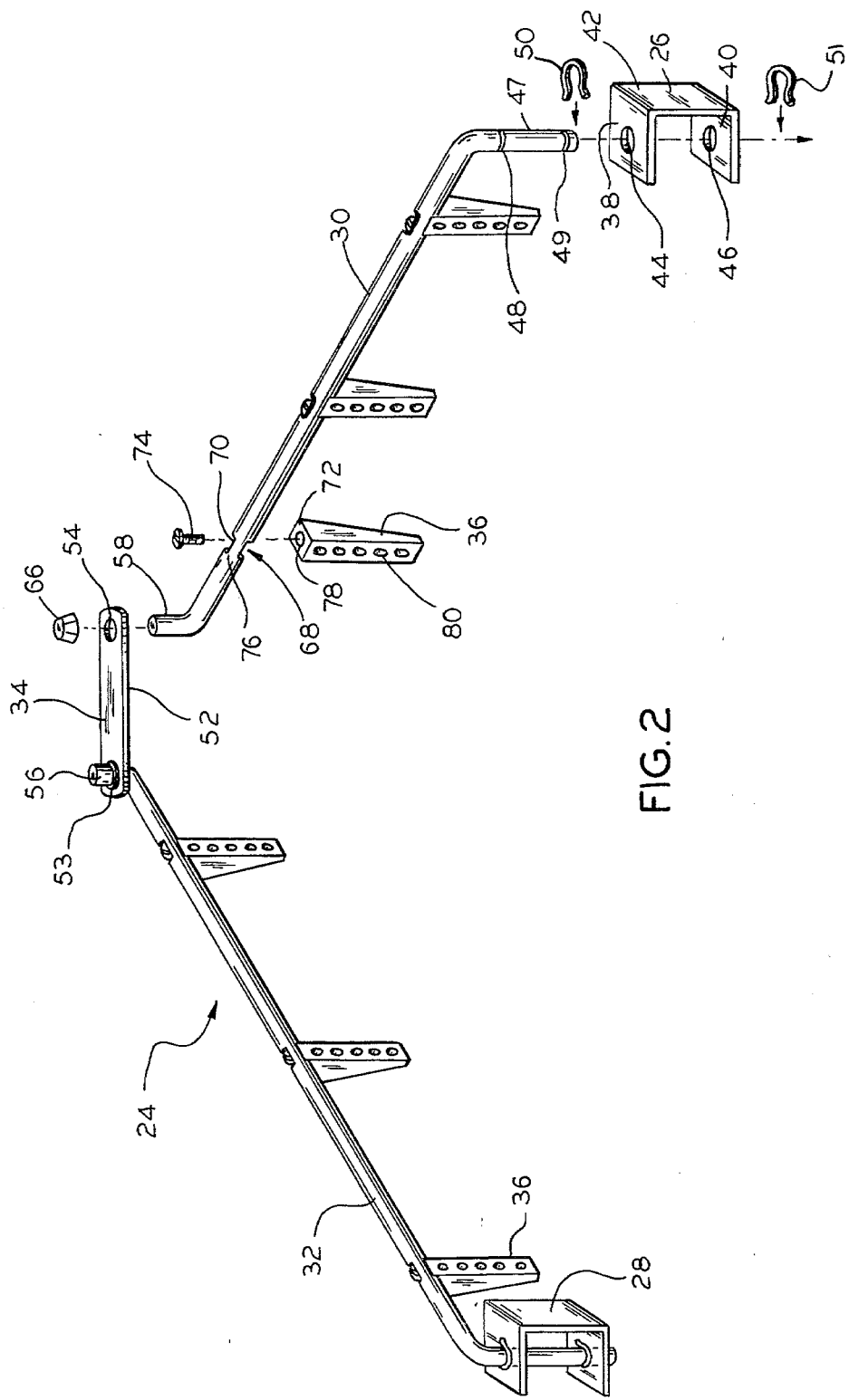
FIG. 2 shows a partially disassembled cable retractor of the present invention in an extended state.

FIG. 2 shows cable retractor 24 in more detail and incompletely assembled. End bracket 26 is U-shaped and has top and bottom horizontal legs 38 and 40 and a vertical central portion 42. Central portion 42 of bracket 26 is attached to a stationary part of rack 10 such as the inside of its rear wall. Top and bottom legs 38 and 40 of bracket 26 are pierced by apertures 44 and 46, which are in vertical registration. Apertures 44 and 46 receive pivot pin 47, which is a terminal end of arm 30 bent substantially at right angles thereto. Pivot pin 47 has annular grooves 48 and 49, the former positioned above leg 38 and the latter positioned below leg 40 when the retractor is assembled. Omega shaped Tinnerman type clips 50 and 51 received in grooves 48 and 49 prevent axial movement of pin 47 into or out of apertures 44 and 46. In this embodiment, second end bracket 28 is rotatably attached to second arm 32 in the same manner that first arm 30 is attached to first end bracket 26.

Pivot plate 34 is a common pivotal linkage comprising a single plate 52 disposed generally in a plane about the horizontal plane swept by arms 30 and 32. Plate 52 has first and second apertures 53 and 54 which respectively receive pivot pins 56 and 58 which are the upturned terminal ends of arms 32 and 30. Pins 56 and 58 could equally be turned downward to receive a pivot plate positioned beneath arms 30 and 32, but substantially above or below the plane of cables 16 and 18. To complete the linkage between the arms and the pivot plate, press-on cup fasteners such as 66 are attached to the portions of pivot pins 56 and 58 which extend through plate 52.

The distance between apertures 53 and 54 in plate 52 in such that when arms 30 and 32 are parallel, the distance between them is at least equal to the minimum acceptable diameter of a bend in the cables attached to the cable retractor.

At least two standoffs such as 36, and preferably more than two standoffs are provided on each arm of the cable retractor. These standoffs are attached at spaced intervals along each arm to support a portion of the cable in a plane which is spaced from but parallel to the plane swept by arms 30 and 32. Standoffs 36 are attache to the arms by any suitable means. In the present embodiment, in which a metal rod of round cross section is used for each arm, opposed recessed flat surfaces such as 68 and 70 may be cut in the arm to respectively receive the top 72 of standoff 36 and the head of screw 74. An aperture 76 connecting flat surfaces 68 and 70 allows the threaded shaft of screw 74 to extend through arm 30 into a threaded aperture 78 formed in the top of standoff 36. Other means to attach the standoffs to the arms may easily be devised by one of ordinary skill in the art. Plural holes such as 80 are provided in each standoff in order to allow attachment of one or more cables to the standoffs. The apertures 80 can be provided with suitable clamps or ties to hold the cables.

Referring back to FIG. 1, the standoff 36 nearest end bracket 28 is spaced sufficiently from second end bracket 28, and second end bracket 28 is spaced sufficiently from the point 20 of attachment of cables to the moving chassis, to allow an appropriate bending radius for the portion of the cable between point 20 and the first standoff. Similarly the standoff nearest the first end bracket 26 is positioned to allow a suitable bending radius for the portion of the conduit between point 22 and the nearest standoff of the cable retractor.

When moving chassis 12 is slid out of rack 10, first and second arms 30 and 32 sweep through a substantially common plane which is parallel to the distinct plane through which the portions of the cables attached to the cable retractor are swept. Plate 34 is maintained in still another parallel plane. Therefore, the central bend in the cables is located under, but away from, pivot plate 34 and arms 30 and 32 to prevent chafing of the cables against the retractor, the slides, or anything else.

We claim:

1. In a cable retractor comprising:
   a first end bracket for attachment to a rack;
   a second end bracket for attachment to a chassis which is slidable with respect to said rack;
   at least first and second cable supporting arms, said first arm having one end pivoted to said first end bracket, said second arm having one end pivoted to said second end bracket, and the other ends of said first and second arms attached to a common pivotal linkage; and
   means to attach a slack portion of a cable to said first and second arms;
   the improvements wherein:
   said first and second arms lie substantially in a first plane throughout their entire range of motion;
   said common pivotal linkage comprises a single plate disposed in a second plane parallel to and nearly adjacent said first plane, said plate rotatably supporting spaced first and second pivot pins to which the respective ends of said first and second arms are fixed; and
   said means to attach said slack portion of said cable to said arm comprises at least two standoffs attached at spaced intervals along each arm to support said slack portion in a third plane spaced from, but parallel to, said first and second planes.

2. The cable retractor of claim 1, wherein said pivot pins each comprise a terminal segment of one of said first and second arms bent to form a substantially right angle with respectg to the rest of the arm.

3. The cable retractor of claim 1, wherein the pivotal connections between the end brackets and the corresponding arms comprises third and fourth pivot pins disposed perpendicular to said first plane, rotatably carried by said end member, and rigidly attached to the end of said arm.

4. In a cable retractor comprising:
   a first end bracket for attachment to a rack;
   a second end bracket for attachment to a chassis which is slidable with respect to said rack;
   at least first and second cable supporting arms, said first arm having one end pivoted to said first end bracket, said second arm having one end pivoted to said second end bracket, and the other ends of said first and second arms attached to a common pivotal linkage; and
   means to attach a slack portion of a cable to said first and second arms;
   the improvements wherein:
   said first and second arms lie substantially in a first plane throughout their entire range of motion;
   said common pivotal linkage comprises a single plate disposed in a second plane parallel to and nearly adjacent said first plane, said plate rotatably supporting spaced first and second pivot pins to which the respective ends of said first and second arms are fixed; and
   the pivotal connections between the end brackets and the corresponding arms comprise third and fourth pivot pins disposed perpendicular to said first plane, rotatably carried by said end member, and rigidly attached to the end of said arm;
   wherein said third and fourth pivot pins are terminal segments of each arm bent to form a substantially right angle with respect to the rest of said arm.

* * * * *